United States Patent [19]

Sherman

[11] 4,199,408

[45] Apr. 22, 1980

[54] METHOD OF FABRICATING A BODY HAVING A PLURALITY OF CONDUCTORS

[75] Inventor: Charles J. Sherman, Westminster, Colo.

[73] Assignee: Western Electric Co. Inc., New York, N.Y.

[21] Appl. No.: 890,724

[22] Filed: Mar. 27, 1978

[51] Int. Cl.² .................. C25D 5/02; C25D 5/54; C25D 7/06
[52] U.S. Cl. .................. 204/15; 204/38 B; 427/118; 427/264
[58] Field of Search .......... 204/15, DIG. 7, 35 R, 204/38 B; 427/260, 261, 264, 270, 271, 275, 278, 118

[56] References Cited

U.S. PATENT DOCUMENTS

| 242,813 | 6/1881 | Chinnock | 204/207 |
|---|---|---|---|
| 380,158 | 3/1888 | Asheson et al. | 204/207 |
| 1,797,552 | 3/1931 | Henriksen | 427/264 |
| 2,556,558 | 6/1951 | Silverman | 204/15 |
| 2,650,900 | 9/1953 | Holman | 204/11 |
| 3,219,557 | 11/1965 | Quintana | 204/15 |
| 3,291,871 | 12/1966 | Francis | 204/15 |
| 3,609,431 | 9/1971 | Lifschitz | 174/117 EF |

OTHER PUBLICATIONS

IBM Tech. Disclosure Bulletin vol. 8, No. 11, Apr. 1966 p. 1485.
Tech. Proceedings of the Electroplaters' Society, vol. 38, 1951 pp. 155-166.
Metal Finishing, Jan. 1972, pp. 46-53 and 60.

Primary Examiner—T. M. Tufariello
Attorney, Agent, or Firm—Joel F. Spivak

[57] ABSTRACT

A method of fabricating a body having a plurality of conductors is disclosed. The method comprises forming a dielectric base which has a plurality of extensions projecting therefrom, the extensions corresponding to the desired plurality of conductors. A conductive path is then formed on each of the extensions.

4 Claims, 9 Drawing Figures

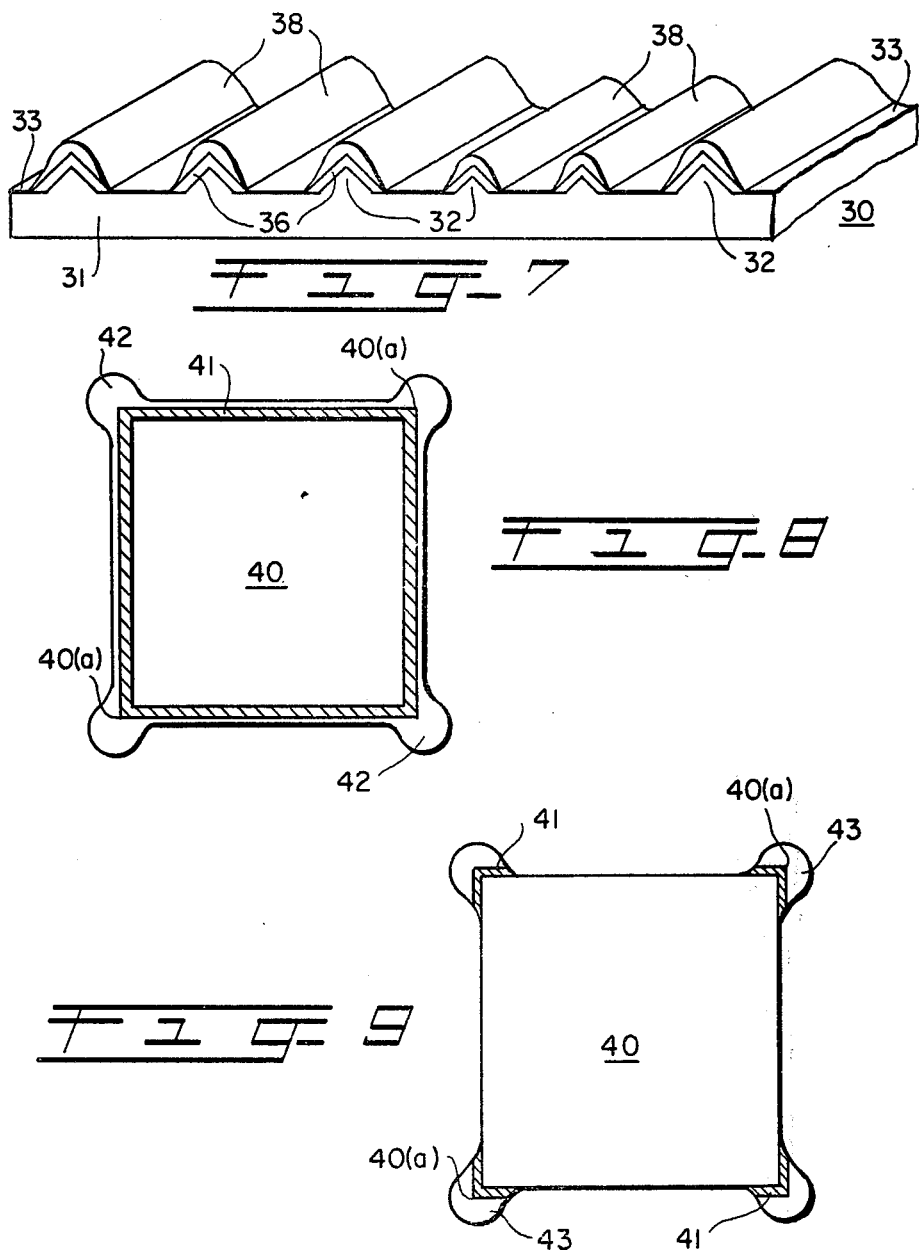

# METHOD OF FABRICATING A BODY HAVING A PLURALITY OF CONDUCTORS

BACKGROUND OF THE INVENTION

1. Field of the Invention

This invention relates to a method of fabricating a body having a plurality of conductors and more particularly, to a method of forming a multiple wire cord or cable.

2. Discussion of the Prior Art

Heretofore, it has been known to form a body, such as a cable, having a plurality of conductors or wires using mechanical means and/or chemical etching techniques. For example, a dielectric base is metal laminated, followed by selective etching to form multiple wire flat cable. This technique and other, mechanical techniques presently employed in multiple wire fabrications are costly and are limited in configuration, mechanical properties and manufacturing efficiency.

A method for fabricating multiple wire cords or flat cables in a continuous and mass generated manner is needed and is desired.

SUMMARY OF THE INVENTION

This invention relates to a method of fabricating a body having a plurality of conductors and more particularly, to a method of forming multiple wire cords or a cable.

The invention comprises forming a dielectric base which has a plurality of extensions projecting therefrom, the extensions corresponding to the desired plurality of conductors. A conductive path is then formed on each of the extensions.

BRIEF DESCRIPTION OF THE DRAWINGS

The present invention will be more readily understood by reference to the following drawing taken in conjunction with the detailed description, wherein:

FIG. 7 is a partial isometric view of the base of FIG. 6 which has been etched;

FIG. 8 is a cross-sectional view of a square or rectangular base having an electroplated metal layer; and FIG. 9 is a cross-sectional view of the base of FIG. 8 which has been etched.

DETAILED DESCRIPTION

The present invention will be discussed primarily in terms of forming a multiple wire or conductor body employing a dielectric base having saw-tooth projections or spearlike juts extending therefrom. It will be readily appreciated that the inventive concept is equally applicable to various shaped dielectric bases having projections or extensions which can be of any shape or configuration such as in the form of angular or arcuate fins or projections.

Figure 1:
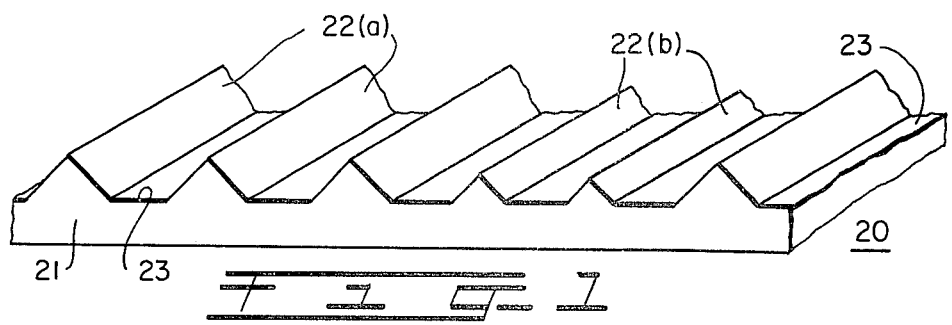
FIG. 1 is a partial isometric view of a dielectric body formed with a base having a plurality of extensions projecting therefrom.

Referring to FIG. 1, a dielectric body 20 is formed, using any conventional technique, e.g., molding, extruding, etc., having a relatively flat base 21 with extensions thereof, 22(a) and 22(b), projecting therefrom. Projections 22(a) and 22(b) may be from one or both major surfaces, but for the purpose of simplicity, extensions 22(a) and 22(b) are illustrated as projecting only from one major surface 23 of base 21. For illustrative purposes only, projections 22(b) are shorter than projections 22(a). It is of course to be understood that the projections extending from surface 23 may be of equal length or of varying lengths as well as varying widths, e.g., at their base. Base 21 may comprise any suitable dielectric material, e.g., glass, ceramic, organic polymers, wood, paper, cardboard, etc.

Figure 2:
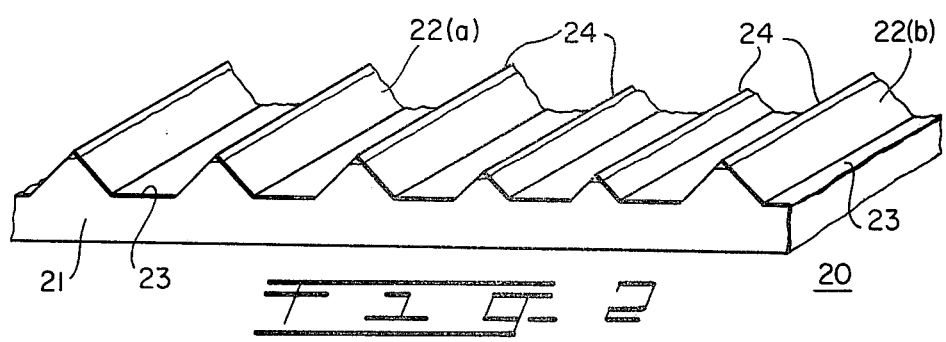
FIG. 2 is a partial isometric view of the base of FIG. 1 which has a conductor path on each of its extensions.

Referring to FIG. 2, a conductive pattern or conductor 24 is formed on each projection 22(a), 22(b). Conductive pattern 24 may be formed using any conventional method. A typical method includes a conventional electroless sequence in which projections 22(a), 22(b) are selectively treated with a sensitizing solution, e.g., aqueous $SnCl_2$, an activating solution, e.g., aqueous $PdCl_2$, followed by immersion of base 21 in an electroless metal deposition solution. Any similar conventional and selective electroless metal deposition process may be employed. Such conventional electroless sequences, sensitizing solutions, activating solutions and electroless metal deposition solutions are well known to those skilled in the electroless metal deposition art and will not be elaborated herein. In that regard, reference is made to *Metallic Coating of Plastics*, William Goldie, Electrochemical Publications, 1968, wherein such processes and solutions are revealed in part. The resultant electroless metal deposit may then be further built up by a conventional electrometallization.

Preferably, conductive patterns 24 are formed by selectively applying a conductive adhesive or a conductive or catalytic ink, such as for example an epoxy ink containing conductive particles, e.g., silver particles, to projections 22(a) and 22(b) and drying or curing the ink or adhesive. The conductive ink or adhesive coated projections 22(a) and 22(b) are then subjected to a conventional electrodeposition to form conductive paths 24.

Figure 3:
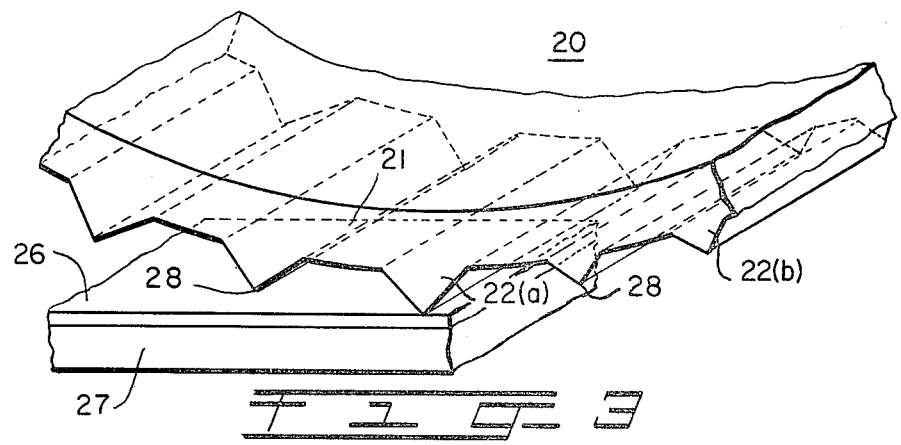
FIG. 3 is a partial isometric view of the base of FIG. 1 which is being selectively coated with a catalytic material utilizing a printing roller or bed.

It is to be pointed out that the selective application of the conductive ink or adhesive can be carried out using conventional printing techniques and apparatus, which are suitable for high speed, high volume processing. For example, the selective application of conductive material may be carried out with printing techniques such as lithography or wet offset, dry offset or letterset, letterpress, flexography, gravure, thermography, hot stamping and transfer printing techniques as well as brushing and stenciling techniques. Such techniques enable continuous and rapid processing of dielectric base 21 for purposes of mass production of multiple wire or multiconductor cable. In this regard, base 21 may be formed as to be suitably deformable whereby even a flat printing roller can be employed to contemporaneously apply the conductive ink to projections 22(a) and to the smaller in height projections 22(b), such application being easily carried out by deforming base 21 as shown in FIG. 3. Referring to FIG. 3, base 21 is deformed into contact with a conductive ink or adhesive containing surface 26 of a printing roller or bed 27. Base 21 is deformed in a continuous fashion whereby the termini 28 of projections 21(a) and 21(b) are selectively coated with the conductive material to form a deposit thereof (not shown) which is then typically electrodeposited using conventional techniques to form conductors 24 (FIG. 2)

Since base 21 and projections 21(a) and 22(b) thereof are very long relative to a conventional printing apparatus, printing roller or bed 27 typically has freedom of displacement to move both up and down and transverse to base 21 and projections 21(a) and 21(b). Of course the longitudinal motion of base 21 to roller 27 may be accomplished by moving either independently or in conjunction with one another.

It is of course understood that printing roller or bed 27 may be deformable to apply conductive ink to projections 21(a) and 22(b) when these projections are of a rigid nature.

It is to be understood that base 21 may comprise a deformable organic polymer material which has a memory, because of the material itself and/or the stresses processed therein. Base 21 can then be deformed to form projections 22(a) and 22(b), as for example by forming rollers. While thus deformed, projections 22(a) and 22(b) are coated with conductive material, as by conventional roller coating. Thereafter, base 21 is permitted to recover or revert back to essentially its original, non-deformed state, typically by exposure to higher than ambient temperatures. Suitable polymers and memory stress producing techniques are well known in the polymer art.

Figure 4:
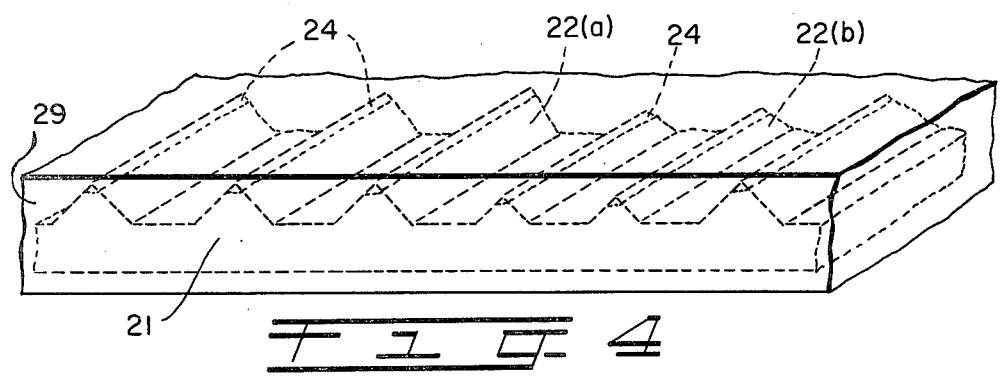
FIG. 4 is a partial isometric view of the base of FIG. 2 which has been encapsulated with a suitable encapsulant.

After forming conductive paths or conductors 24 which conform in shape and number to the conductors of a desired multiple wire cable, base 21 may be treated with a suitable encapsulant in a conventional manner well known to those skilled in the art whereby base 21 and conductors 24 are coated by an encapsulant coat 29 such as for example, a polyvinyl chloride coat, an epoxy coat, etc., as shown in FIG. 4.

Figure 5:
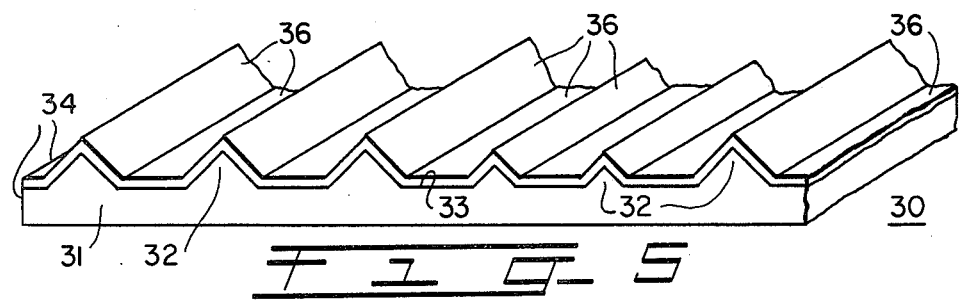
FIG. 5 is a partial isometric view of a dielectric base having configured portions.

In another embodiment, referring to FIG. 5, a dielectric body 30 is formed, e.g., as by extrusion, having a base 31 with a plurality of first portions 32 configured in a shape and/or configuration to enhance electrodeposition of a metal thereon at a rate which is relatively greater than remaining portions of base 31. It is known in the electroplating art that bodies are not evenly electroplated due to the shape or configurations of portions of the bodies. Accordingly, great efforts are made in the electroplating art to "level" the amount of electrodeposition over the surface of a body whereby a uniform electrodeposit thereover is obtained. In this regard, reference is made to L. F. Spencer, *Metal Finishing*, pages 46 through 53 and page 60 (January 1972), where bodies are designed to avoid such uneven plating. Reference is also made to R. Schaeffer et al., *Technical Proceedings of the Electroplaters' Society*, Vol. 38, pages 155 through 166 (1951), where considerations of current distribution in an electroplating solution are discussed with regard to uneven electroplating.

The subject invention however utilizes the naturally occurring non-uniformity of an electrodeposit to obtain a multiple conductor body, such as a cable. Accordingly, portions 32 are illustrated as being projecting from principal surface 33 of base 31 in the form of spear-like juts, such a configuration being subject to a greater current distribution and thus a greater rate of electrodeposition than other portions of surface 33, including even edges 34 of body 30. It is of course understood that projections or portions 32 may comprise projecting arcuate fins, or any configuration which enhances electrodeposition thereon.

Figure 6:
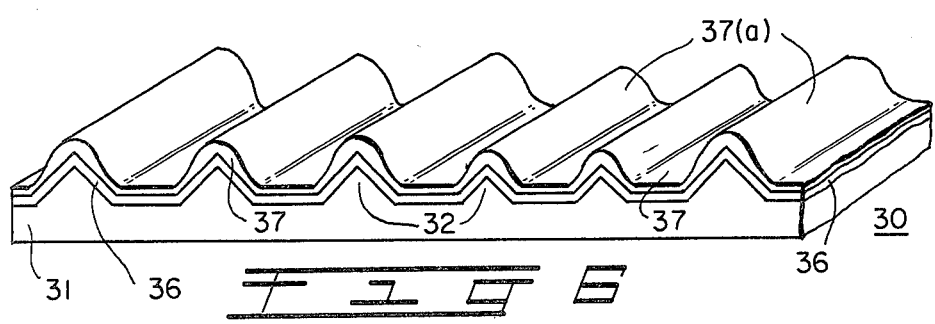
FIG. 6 is a partial isometric view of the base of FIG. 5 which has an electroplated metal coat or layer thereon.

A conductive film 36 is deposited on surface 33 including the surface of portions 32. Conductive film 36 may be formed using any conventional technique such as a conventional electroless metal deposition sequence, or the application of a conductive ink or adhesive. Referring to FIG. 6, base 31 having conductive film 36 thereon is subjected to a conventional electrodeposition, whereby a metal deposit 37 is deposited on conductive film 36. Due to the configuration of portions 32, deposit 37 thereon, designated as 37(a), is much heavier than on other areas of base 31. In this regard, the electrodeposition is carried out under conditions whereby such a heavier deposition is fostered. For example, an electroplating solution is employed which does not contain a leveling agent and which has a low throwing power. Factors such as close anode-to-cathode spacing to increase non-uniformity, agitation to increase non-uniformity and high current densities to increase non-uniformity may also be employed. Such conditions resulting in uneven electrodeposition are well known in the electrodeposition art and/or are easily ascertained experimentally.

Base 31 is then treated with an etching solution, e.g., aqueous $HNO_3$ for copper metal and silver filled ink or adhesive, whereby electrodeposited metal layer 37 is etched as well as underlying conductive layer 36. Since deposited metal layer 37 is heavier at regions 37(a) thereof, a discrete metal conductor 38 situated thereat will remain (as well as at least the conductive material of layer 36) after the metal deposit 37 [FIG. 6] is removed from the other portions of base 31, as is shown in FIG. 7. Thus body 30 having a plurality of conductors 38 is formed which can be used as multiple conductor cable after encapsulation with a suitable encapsulant.

Referring to FIG. 8, a rectangular or square body 40 may be employed to form a multiple conductor cable. Body 40 is coated with a conductive layer 41, using any conventional technique, followed by electrodeposition of a metal layer 42. Again, because of the greater current density at angular configurations, metal layer 42 is greater or thicker at edges 40(a) of body 40. Metal deposited body 40 is subjected to a slitting operation to remove both ends thereof which have a uniformly heavy metal deposit on all four edges and the resultant cut body 40 is then etched with a suitable etchant to remove metal deposit 42 and conductive layer 41 thereunder. Because of the heavier deposit at edges 40(a), a conductor 43 remains after the complete etching or removal of layer 42 (FIG. 8) from the portions of body 40 other than at edges 40(a), as illustrated in FIG. 9.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method of fabricating a body having a plurality of conductors, which comprises:
   forming a dielectric body having a plurality of first body portions configured to enhance electrodeposition thereon relative to electrodeposition on a second body portion, said plurality of first body portions corresponding to the desired plurality of conductors;

depositing an electrically conductive coat on said body including at least said plurality of first body portions and said second body portion;

electroplating said coated body to form a first metal deposit on said plurality of first body portions and a second metal deposit on said second body portion, said first deposit being greater than said second deposit; and etching said electroplated body to remove at least said second metal deposit to form a body having only said plurality of first body portions metal deposited.

2. The method as defined in claim 1 wherein said first body portions comprise extensions projecting from said body.

3. The body formed by the process of claim 1.

4. A method of fabricating a body having a plurality of conductors, which comprises:
 (a) deforming a dielectric base comprising an organic polymer material with a memory to form a plurality of extensions projecting therefrom, said extensions corresponding to the plurality of conductors;
 (b) forming a conductive path on each of said formed extensions to form the plurality of conductors;
 (c) treating said deformed base to essentially render said deformed base back to its original non-deformed state; and
 (d) electrodepositing a metallic layer over the conductive paths.

* * * * *